(12) United States Patent
Freimann et al.

(10) Patent No.: US 7,643,149 B2
(45) Date of Patent: Jan. 5, 2010

(54) METHOD OF ALIGNING AN OPTICAL SYSTEM

(75) Inventors: Rolf Freimann, Aalen (DE); Ulrich Wagemann, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 209 days.

(21) Appl. No.: 11/920,838

(22) PCT Filed: May 23, 2006

(86) PCT No.: PCT/EP2006/004900

§ 371 (c)(1),
(2), (4) Date: Nov. 21, 2007

(87) PCT Pub. No.: WO2006/125609

PCT Pub. Date: Nov. 30, 2006

(65) Prior Publication Data

US 2009/0231593 A1 Sep. 17, 2009

Related U.S. Application Data

(60) Provisional application No. 60/684,439, filed on May 24, 2005.

(51) Int. Cl.
*G01B 9/021* (2006.01)
*G01B 11/02* (2006.01)
(52) U.S. Cl. ...................... 356/458; 356/508
(58) Field of Classification Search .............. 356/457, 356/458, 498, 508, 510
See application file for complete search history.

(56) References Cited

U.S. PATENT DOCUMENTS 4,396,289 A * 8/1983 Fantone ...................... 356/458
4,758,089 A * 7/1988 Yokokura et al. ........... 356/458
4,783,055 A 11/1988 Widen et al.
4,812,042 A * 3/1989 Yokokura et al. ........... 356/458
4,872,755 A 10/1989 Küchel (Continued)

FOREIGN PATENT DOCUMENTS

DE 102 23 581 12/2003

(Continued)

OTHER PUBLICATIONS

U.S. Appl. No. 11/233,435, filed Sep. 21, 2005, Hetzler et al.

(Continued)

*Primary Examiner*—Patrick J Connolly
(74) *Attorney, Agent, or Firm*—Townsend and Townsend and Crew LLP

(57) ABSTRACT

A method of manufacturing an optical system having plural optical elements mounted relative to each other on a mounting structure of the optical system comprises disposing the optical system in a beam path of an interferometer apparatus having an interferometer optics and a selectable hologram for shaping a beam of measuring light to be incident on surfaces of the optical elements of the optical system; selecting a first hologram of the interferometer apparatus and recording at least one first interference pattern generated by measuring light reflected from a surface of a first optical element; selecting a second hologram of the interferometer apparatus, wherein the second hologram is different from the first hologram, and recording at least one second interference pattern generated by measuring light reflected from a surface of a second optical element, which is different from the first optical element; and adjusting a position of the first optical element relative to the second optical element on the mounting structure based upon the first interference pattern and the second interference pattern.

18 Claims, 5 Drawing Sheets

U.S. PATENT DOCUMENTS

| | | | |
|---|---|---|---|
| 5,039,223 A * | 8/1991 | Gemma et al. | 356/458 |
| 5,282,016 A | 1/1994 | Shen et al. | |
| 5,530,547 A * | 6/1996 | Arnold | 356/458 |
| 7,072,042 B2 * | 7/2006 | Kim et al. | 356/458 |
| 7,145,659 B2 * | 12/2006 | Yasuda et al. | 356/458 |
| 2003/0067684 A1 | 4/2003 | Kim | |
| 2003/0137671 A1 | 7/2003 | De Groot et al. | |
| 2003/0160968 A1 | 8/2003 | Deck | |
| 2003/0164951 A1 | 9/2003 | Deck | |
| 2005/0083537 A1 * | 4/2005 | Kuchel | 356/513 |
| 2005/0117167 A1 * | 6/2005 | Yasuda et al. | 356/512 |

FOREIGN PATENT DOCUMENTS

| | | |
|---|---|---|
| EP | 0 906 590 | 8/2003 |
| JP | 2002257525 | 9/2002 |
| JP | 2004177334 | 6/2004 |
| WO | WO 03/050470 | 6/2003 |

OTHER PUBLICATIONS

A.G. Poleshchuk, "Alignment of Diffraction and Refraction Components in Optical Systems", Avtometriya, No. 6, pp. 27 to 31, 1985.

J. Burge et al., "Optical test alignment using computer generated holograms," in *Optical Fabrication and Testing*, A. Sawchuk, ed., vol. 76 of OSA Trends in Optics and Photonics Series, Optical Society of America, 2002, pp. 105-107, paper OWD2.

L. Deck et al., "Advances in laser Fizeau interferometry for optical testing," in *Optical Fabrication and Testing*, A. Sawchuk, ed., vol. 76 of OSA Trends in Optics and Photonics Series, Optical Society of America, 2002, pp. 108-111, paper OWD3.

V. Koronkevich et al., "White light diffractive common-path interferometer", in *Optical Fabrication and Testing*, A. Sawchuk, ed., vol. 76 of OSA Trends in Optics and Photonics Series, Optical Society of America, 2002, pp. 115-117, paper OWD3.

M. McBurney, "Background Subtraction for NIF Large Optics Interferometry Measurement", in *Optical Fabrication and Testing*, A. Sawchuk, ed., vol. 76 of OSA Trends in Optics and Photonics Series, Optical Society of America, 2002, pp. 118-120, paper OWD6.

F. Pan et al., "Measurement of Aspherical Surfaces Using Test Plate and Computer Generated Hologram (CGH)", in *Optical Fabrication and Testing*, A. Sawchuk, ed., vol. 76 of OSA Trends in Optics and Photonics Series, Optical Society of America, 2002, pp. 121-123, paper OWD7.

T.G. Parham, "Focal length measurements for the National Ignition Facility large lenses", in *Optical Fabrication and Testing*, A. Sawchuk, ed., vol. 76 of OSA Trends in Optics and Photonics Series, Optical Society of America, 2002, pp. 124-126, paper OWD8.

C. Guo et al, "Phase-shifting with computer-generated holograms written on a spatial light modulator", Applied Optics, Dec. 10, 2003, vol. 42, No. 35, pp. 6975 to 6979.

E.U. Wagemann et al., "Adaptive trapping of microscopic particles by dynamic computer-generated holograms written on a TN-LCD", Symposium on Industrial Lasers and Insepction and Envirosense, Jun. 1999, Munich, Germany.

S.M. Arnold , "Figure Metrology of Deep General Aspherics Using a Conventional Interferometer with CGH Null", 1995, SPIE vol. 2536, pp. 106 to 116.

K. Creath et al., "Holographic and Speckle Tests", in *Optical Shop Testing*, Second Edition, Ed. by Daniel Malacara, 1992, John Wiley & Sons, Inc., Chapter 15, pp. 599 to 651.

D. Malacara, "Twyman-Green Interferometer", in *Optical Shop Testing*, Second Edition, Ed. by Daniel Malacara, 1992, John Wiley & Sons, Inc., Chapter 2.1., pp. 51 to 53.

S. Reichelt et al., "Wavefront aberrations of rotationally symmetric CGHs fabricated by a polar coordinate laser plotter", Journal of Modern Optics, 2002, vol. 49, No. 7, pp. 1069 to 1087.

International Search Report mailed Aug. 4, 2006 for International Patent Application PCT/EP2006/004900 including the Written Opinion of the International Searching Authority.

* cited by examiner

METHOD OF ALIGNING AN OPTICAL SYSTEM

The present application is a National Stage application under 35 U.S.C. 371 of International Application No. PCT/EP2006/004900, filed on May 23, 2006, which was published in the English language on Nov. 30, 2006, and which claims the benefit under 35 U.S.C. 119(e) of U.S. Provisional Patent Application No. 60/684,439, filed on May 24, 2005. The entire contents of each of the above-identified applications are incorporated herein by reference.

BACKGROUND OF THE INVENTION

1. Field of the Invention

The present invention generally relates to a method of manufacturing an optical system. In particular, the invention relates to adjusting lenses of an optical system relative to each other.

2. Brief Description of Related Art

Generally, a performance of an optical system is determined by a quality of its optical components, such as lenses and mirrors, comprised by the system, and by an accuracy of an alignment of the optical components relative to each other. Typically, the optical elements are made of a glass or other suitable material, and their optical surfaces are processed to have a surface shape corresponding to a specification of the optical system. Thereafter, each optical element is attached to a mounting frame made of metal or other suitable material, wherein the mounting frame provides mechanical attachment means, such as flanges, through-holes and others. Thereafter, the optical system is assembled by attaching the respecting mounting frames to each other in such a way that positions, such as distances and orientations, of the optical elements relative to each other conform with the specification of the optical system. Thus, the manufacture of the optical system comprises manufacture of optical elements, manufacture of mounting frames, aligning each optical element relative to its mounting frame and aligning the mounting frames relative to each other. Especially in the field of photolithography, the trend to ever smaller structures of semiconductors places ever higher demands on the quality of the optical imaging systems, and thus on the alignment of the optical elements relative to each other.

SUMMARY OF THE INVENTION

The present invention has been accomplished taking the above problems into consideration.

Embodiments of the present invention provide a method of manufacturing an optical system allowing an improved alignment of optical elements relative to each other.

According to an exemplary embodiment, a method of manufacturing an optical system comprises: disposing the optical system in a beam path of an interferometer apparatus having an interferometer optics and a selectable hologram for shaping a beam of measuring light to be incident on surfaces of the optical elements of the optical system; selecting a first hologram of the interferometer apparatus and recording at least one first interference pattern generated by measuring light reflected from a surface of a first optical element; selecting a second hologram of the interferometer apparatus, wherein the second hologram is different from the first hologram, and recording at least one second interference pattern generated by measuring light reflected from a surface of a second optical element, which is different from the first optical element; and adjusting a position of the first optical element relative to the second optical element on the mounting structure based upon the first interference pattern and the second interference pattern.

In such method, one single interferometer apparatus may be used for generating beams of measuring light which are differently shaped. For example, a first beam of generated measuring light has wavefronts of a first shape, and a second beam of generated measuring light has wavefronts of a second shape. The shape of the wavefront of the first beam is determined such that measuring light generated from a surface of a first optical element of the system generates a first interference pattern, and the shape of the wavefronts of the second beam is designed such that measuring light reflected from a surface of a second optical element of the system generates a second interference pattern. Further, the two beams are shaped such that measuring light of the first beam reflected from other surfaces of the optical system do not contribute to the first interference pattern to such an extent that evaluation of the pattern generated by measuring light reflected from the surface of the first optical element may not be evaluated to a sufficient accuracy. Similarly, the second beam is shaped such that measuring light of the second beam reflected from other surfaces of the optical systems than the surface of the second optical element does not contribute to the second interference pattern to such an extent that evaluation thereof to a sufficient accuracy is prevented.

Thus, the first and second beams of measuring light may be subsequently generated by the interferometer for subsequently recording the first interference pattern and the second interference pattern. The first and second interference patterns represent information of positions of the first and second optical elements relative to the interferometer. By evaluating the first and second interference patterns it is possible to determine a deviation of the relative position of the first and second optical elements relative to each other from a predetermined desired relative position of these optical elements, and the relative position of the first and second optical elements may be adjusted in accordance with such evaluation.

Determining the absolute position of each of the first and second optical elements relative to the interferometer optics may be limited by a manufacturing accuracy of the interferometer optics. Since components of the interferometer optics are the same in generating the first and second beams of measuring light, largely similar measuring errors contribute to the interferometric measurements of the surfaces of the first and second optical elements, such that the relative position of the first and second optical elements may be determined with a higher accuracy which is, in a first approximation, not limited by the error originating from an inaccuracy of the interferometer optics.

Selectable holograms are used for generating the different beams of measuring light.

According to an exemplary embodiment, each of the selectable holograms is provided on a substrate carrier, and one or the other substrate carrier is disposed in the beam path of the measuring light for shaping of the wavefronts thereof.

According to a further exemplary embodiment, a spatial light modulator is provided in the beam path of the measuring light. The spatial light modulator is controlled to selectably produce the first or second hologram. An example of a spatial light modulator has a plurality of liquid crystal elements arranged in an array. The liquid crystal elements may be energized according to a desired pattern such that the array provides phase changes and/or amplitude changes according to such pattern to light traversing the spatial light modulator.

According to a further exemplary embodiment, the method comprises selecting a third hologram of the interferometer and recording at least one third interference pattern generated by measuring light reflected from a surface of a third optical element of the optical system. According to further embodiments, more than three interference patterns are subsequently generated, wherein each interference pattern results from measuring light reflected from a surface of one single optical element.

According to a further exemplary embodiment, a position of a first optical element relative to a second optical element is adjusted based on first and second interference patterns recorded as illustrated above, and thereafter, a third optical element is mounted to the mounting structure of the first and second optical elements. Thereafter, a third hologram is selected to generate measuring light such that the measuring light reflected from a surface of the third optical element generates a third interference pattern allowing to adjust the position of the third optical element relative to the first and second optical elements. This process may be repeated by successively adding and adjusting additional optical elements to assemble an optical system having more than three optical elements precisely adjusted relative to each other.

The selectable holograms may be determined by methods such as ray-tracing which may be used to simulate the propagation of the measuring light through the interferometer optics, the respective hologram and through the components of the optical system traversed by the measuring light and including the reflection of the measuring light from the respective surface of the optical system.

According to a further embodiment, the present invention provides an optical system which is manufactured by using the method as illustrated above.

According to an exemplary embodiment, the optical system is a projection exposure system used in a lithographic process. The projection exposure system is configured to expose a substrate disposed in an image plane of the optical system with an image of a patterning structure disposed in an object plane of the optical system.

BRIEF DESCRIPTION OF THE DRAWINGS

The foregoing as well as other advantageous features of the invention will be more apparent from the following detailed description of exemplary embodiments of the invention with reference to the accompanying drawings. It is noted that not all possible embodiments of the present invention necessarily exhibit each and every, or any, of the advantages identified herein.

DETAILED DESCRIPTION OF EXEMPLARY EMBODIMENTS

Figure 1:
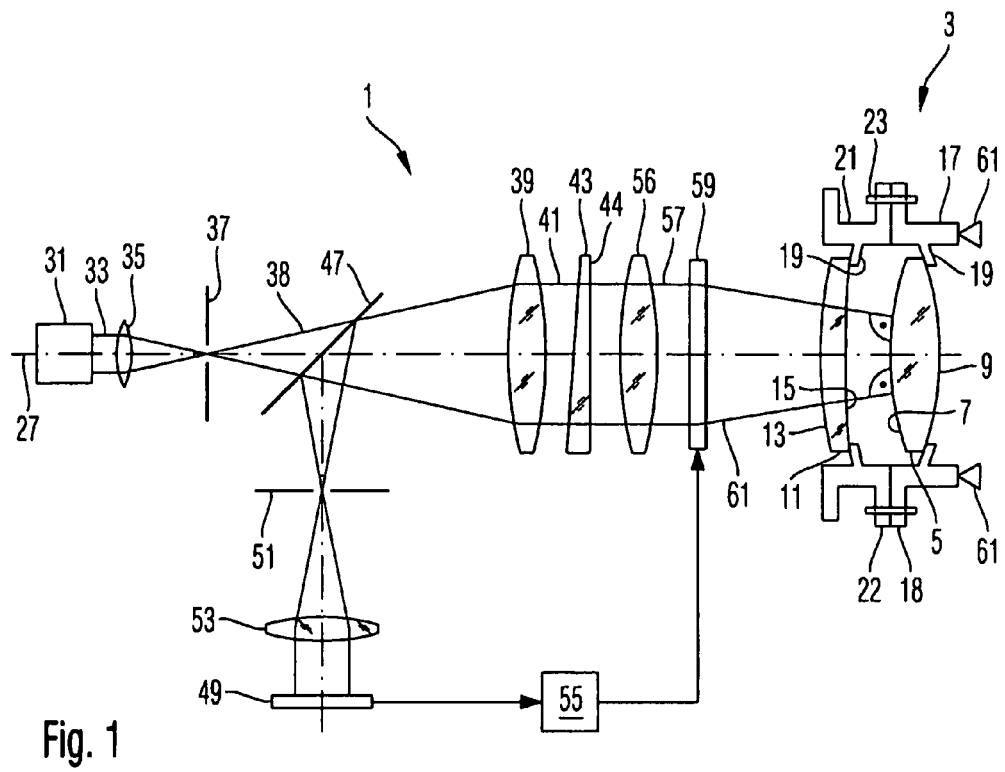
FIG. 1 illustrates an optical system comprising two lenses mounted in a beam path of an interferometer wherein a first hologram is selected for testing a surface of a first lens.

In the exemplary embodiments described below, components that are alike in function and structure are designated as far as possible by alike reference numerals. Therefore, to understand the features of the individual components of a specific embodiment, the descriptions of other embodiments and of the summary of the invention should be referred to.

FIG. 1 schematically illustrates an interferometer apparatus 1 for testing an optical system 3. The optical system 3 comprises a first lens 5 having a front surface 7 and a back surface 9, and a second lens 11 having a front surface 13 and a back surface 15. The lens 5 is mounted on a frame 17 having plural supporting lugs 19 distributed about a circumference of the frame 17 and contacting the back surface 9 of the lens 5 at a periphery thereof.

Similarly, lens 11 is supported by supporting lugs 19 of a mounting frame 21. The supporting frame 17 has a flange 18 joined to a flange 22 of mounting frame 21 by a plurality of bolts 23. The bolts 23 traverse through-holes provided in the flanges 18 and 22 and have sufficient play to adjust a relative position between the flange 18 and 22 such that the lenses 5 and 11 may be displaced relative to each other in a direction transverse to an axis 27. Further, suitable spacers may be disposed between the flanges 18 and 22 to adjust a distance between the lenses 5 and 11 in a direction of the axis 27, and, still further, the supporting lugs 19 of the lenses 5 and 11 are sufficiently flexible and allow plastic deformation to adjust an orientation of the lenses relative to the axis 27.

It is assumed that the surfaces 7, 9, 13, 15 of lenses 5 and 11 are manufactured according to a specification of the optical system 3. For providing the optical performance according to the specification, it is further necessary that also the relative position of lenses 5 and 11 fulfils the specification.

The interferometer apparatus is used to generate measuring data allowing to adjust the relative position of lenses 5 and 11 to conform with the specification.

The interferometer apparatus 1 comprises a light source 31, such as a helium-neon-laser, for generating a light beam 33. Beam 33 is focused by a focusing lens arrangement 35, such as a micro-objective, onto a pinhole of a spatial filter 37 such that a diverging beam 38 of coherent light originates from the pinhole of the spatial filter 37. Wavefronts in the diverging beam 38 are substantially spherical wavefronts. The diverging beam 38 is collimated by a collimating lens arrangement 39 to form a substantially parallel beam 41 having substantially flat wavefronts. Parallel beam 41 traverses a wedge-shaped plate 43 having a flat surface 44 which is orthogonally disposed in the beam 41 to form a Fizeau surface of the interferometer apparatus 1. The Fizeau surface 44 is semi-transparent and reflects a portion of the intensity of the beam 41 to form a beam of reference light which travels back along optical axis 27, is collimated by the collimating lens arrangement 39 to form a converging beam which is reflected from a beam splitter 47 disposed in diverging beam 38, and to be incident on a camera 49 after traversing a spatial filter 51 and a camera optics 53. The camera 49 may be of a CCD type having a plurality of photosensitive pixels for detecting an interference pattern which is output to a controller 55.

A portion of the light beam 41 traversing the Fizeau surface 44 is collimated by an interferometer optics 56 to form a converging beam 57 traversing a spatial light modulator 59 controlled by a suitable control portion of controller 55.

The spatial light modulator has a plurality of liquid crystal elements which may be selectively switched by the controller 55 to provide selective phase and/or amplitude changes to portions of the beam 57 traversing the respective liquid crystal elements. By energizing the liquid crystal elements according to a pattern supplied by the controller 55, the beam 57 experiences a diffraction determined by the pattern. Thus, the function of the spatial light modulator may be understood as a hologram generating light of plural different diffraction orders, wherein the light beam of each diffraction order has wavefronts shaped according to the diffraction pattern of the hologram produced by the spatial light modulator 59.

An example of a spatial light modulator is the XY Amplitude Series spatial light modulator which may be obtained from Boulder Nonlinear Systems, Inc. Lafayette, Colo., USA.

The excitation pattern applied to the spatial light modulator 59 shown in FIG. 1 is determined such that the beam 61 of measuring light diffracted by the spatial light modulator in first order traverses the lens 11 and is incident on the front surface 7 of lens 5 such that the measuring light 61 is incident on surface 7 substantially orthogonal at each location of the illuminated portion of surface 7. The light incident on surface 7 is reflected back and traverses the spatial light modulator 59, the interferometer optics 55, the Fizeau surface 44 and the collimating optics 39 on substantially the same beam path as the incident measuring light. Thus, the measuring light reflected from the front surface 7 of lens 5 is superimposed on the detector 49 with the reference light reflected from the Fizeau surface 44 to generate the interference pattern on the detector 59. Since the light reflected from surface 7 is orthogonally reflected therefrom, this light will traverse the pinhole of spatial filter 51, whereas measuring light reflected from other surfaces, such as lens surfaces 9, 13 and 15 and measuring light diffracted by the spatial light modulator 59 into other diffraction orders than the first diffraction order and reflected from lens surfaces 7, 9, 13 and 15, will substantially not be able to traverse the spatial filter 51. Thus, this light will substantially not contribute to the interference pattern generated on the detector 49 by the measuring light reflected from surface 7 and superimposed with reference light reflected from the Fizeau surface 44.

The excitation pattern applied to the spatial light modulator 59 is determined such that the generated interference pattern is a predetermined interferogram if the position of the lens 5 relative to the interferometer apparatus 1 is a predetermined position. By analyzing the generated interference pattern and comparing the generated interference pattern with the predetermined interferogram, it is possible to determine deviations of the position of the lens 5 from its predetermined position. The position of the lens 5 is then adjusted to better conform with the predetermined position, and a further generated interference pattern may be analyzed to iteratively improve the position of the lens 5 relative to the interferometer apparatus 1. For this purpose, triangles 61 in FIG. 1 represent a support of the interferometer apparatus for mounting frame 17 relative to the interferometer apparatus. The support 61 has suitable actuators (not shown in FIG. 1) to achieve the desired adjustment of the position of lens 5 relative to the interferometer apparatus 1.

Thereafter, the spatial light modulator 59 is energized such that the hologram produced by the spatial light modulator 59 is a second selected hologram which shapes the beam 61 of measuring light such that it is substantially orthogonally incident on the front surface 13 of the lens 11 of the optical system 3. The second hologram is selected such that the interference pattern generated on the detector 49 is a predetermined second interferogram if the position of lens 11 relative to lens 5 is a predetermined position conforming to the specification of the optical system 3. By analyzing the generated interference pattern, it is possible to determine a deviation of the relative position of lenses 11 and 5 from the predetermined relative position. It is then possible to adjust the relative position of lenses 11 and 5 by adjusting the position of frame 21 relative to frame 17 by adding or removing spacers between the flanges and moving flange 21 in a direction transverse to the axis 27, and by adjusting the supporting lugs 19 of frame 21.

A further interference pattern may be recorded thereafter, and further adjustments of the relative positions of lenses 5 and 11 may be made in an iterative process.

After having adjusted the relative position of lenses 5 and 11, the bolts 23 are fixed to maintain the relative position of the lenses. Thereafter, a third lens 71 is added to the optical system 3. The third lens 71 is supported by supporting lugs 19 of a mounting frame 73 joined to mounting frame 21 by bolts 75 traversing a flange 77 of frame 73 and a flange 79 of frame 21 as shown in FIG. 3.

The lens 71 has a front surface 81 and a back surface 83, and a position of the lens 71 relative to the lenses 5 and 11 will be adjusted by using the interferometer apparatus 1.

Figure 3:
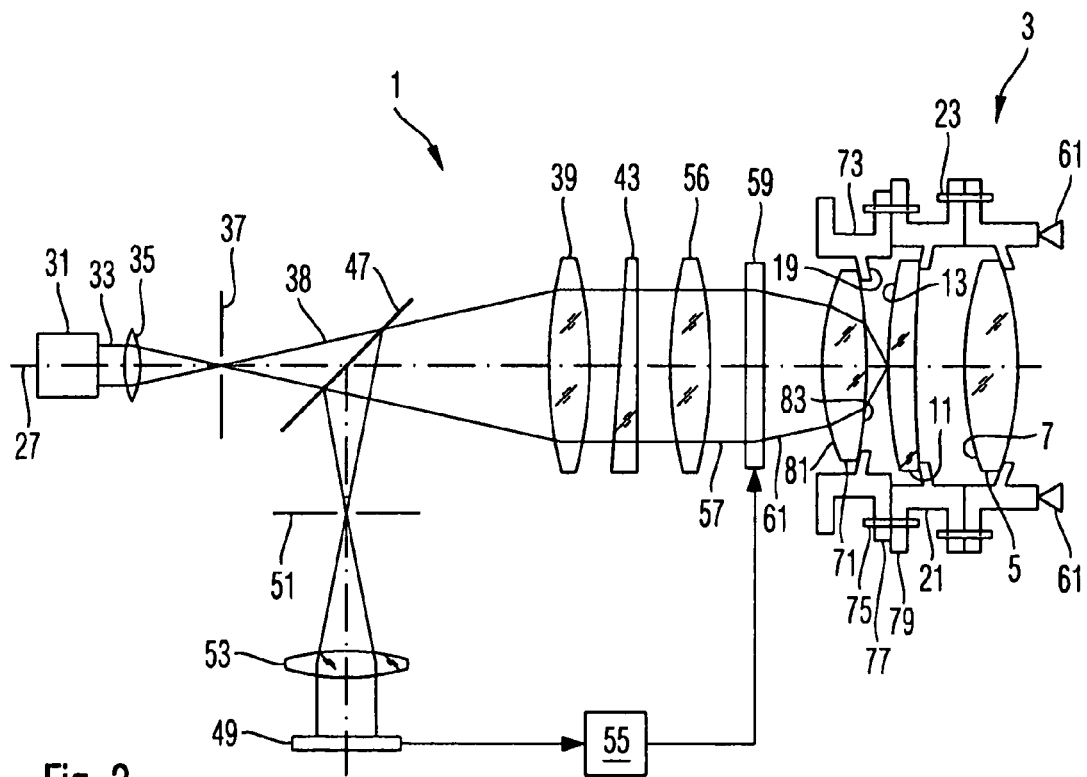
FIG. 3 shows the optical system of FIG. 1 mounted in the beam path of the interferometer wherein a third lens has been added to the optical system and wherein a hologram is selected for testing a surface of the second lens.
Figure 4:
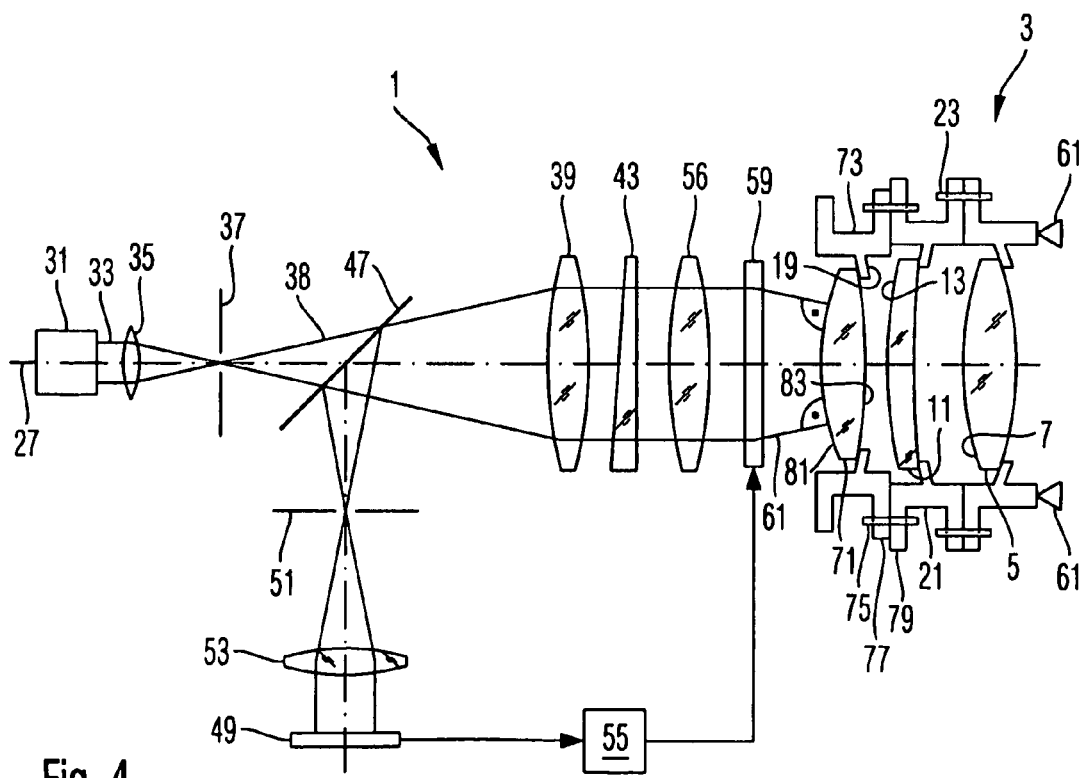
FIG. 4 shows the arrangement of FIG. 3 wherein a hologram for testing a surface of the third lens is selected.

For this purpose, the distance of the optical system 3 from the interferometer apparatus 1 is adjusted by performing an interferometric measurement as illustrated in FIG. 3, wherein the adjustment is performed by operating the corresponding actuators of support 61. The spatial light modulator 59 is energized such that the beam 61 of measuring light traversing the modulator 59 traverses the lens 71 and is focused onto the front surface 13 of lens 11 at a central location thereof disposed on the axis 27. If the generated interference pattern differs from a corresponding predetermined interferogram, this will be indicative of a difference between the desired predetermined position and the current position of the optical system 3 relative to the interferometer apparatus, and a corresponding adjustment can be made.

Figure 2:
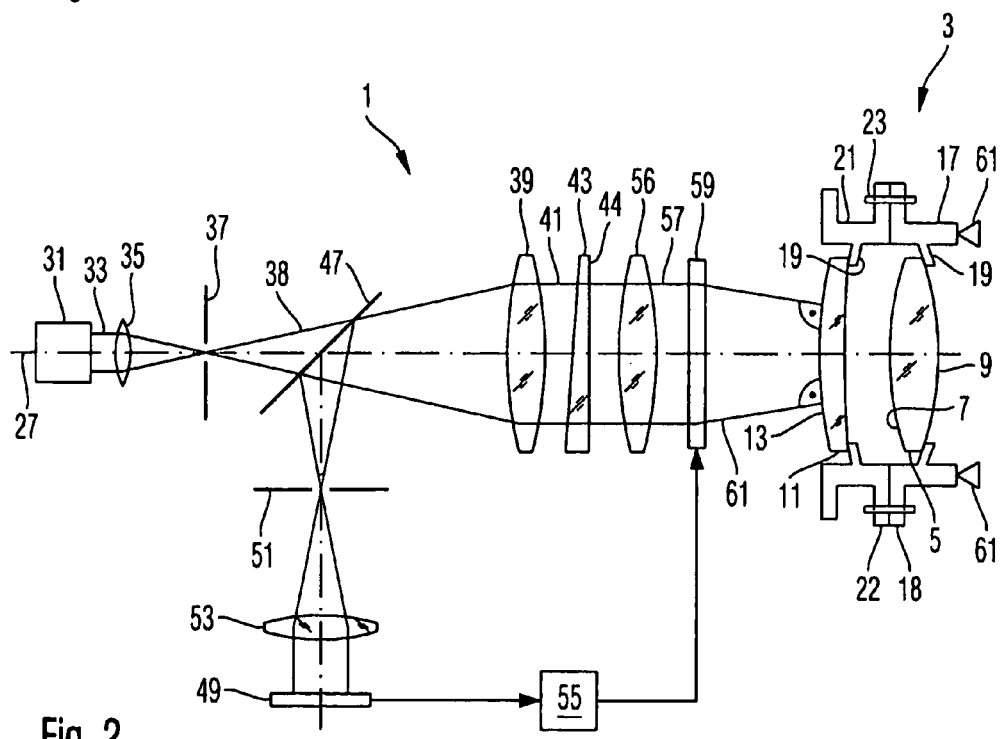
FIG. 2 shows the arrangement shown in FIG. 1 wherein a second hologram is selected for testing a second lens of the optical system.

In this example shown in FIG. 3, the beam of measuring light is focused on a location on the surface 13 of lens 11. It is, however, also possible to select a suitable hologram produced by the spatial light modulator 59 such that the beam of measuring light is orthogonally incident on the surface 13 as illustrated with reference to the examples of FIGS. 1 and 2 above. If the measuring light is orthogonally incident on an extended portion of the lens surface, the resulting interference pattern allows for a determination of the position of the lens surface with respect to its distance from and orientation relative to the interferometer apparatus 1. In the configuration illustrated in FIG. 3, which is also referred to as cat's eye arrangement in the field of interferometry, the generated interference pattern is not very sensitive to the orientation of the lens surface relative to the interferometer apparatus but still allows a relatively precise determination of the distance of the lens surface from the interferometer apparatus.

After the adjustment of the position of lenses 11 and 5 relative to the interferometer apparatus 1 is made, the spatial light modulator 59 is energized according to a further selected predetermined pattern to produce a hologram such that the beam 61 of measuring light is orthogonally incident on surface 81 of lens 71. The resulting interference pattern is compared to a predetermined interferogram which will be generated if the position of lens 71 relative to the lens 11 is a predetermined position conforming with the specification of the optical system 3. The corresponding adjustment of the position of lens 71 is made by adjusting the supporting lugs 19 of lens 71 and the position of frames 73 and 21 relative to each other in a similar manner as illustrated above for the relative position of lenses 5 and 11 with reference to FIGS. 1 and 2. Again, the adjustment and the measurement by analyzing the generated interference pattern may be iteratively repeated to achieve the adjustment conforming with the specification of the optical system 3.

It is apparent that further lenses may be added to the optical system 3 and that the relative position of the newly added lens relative to the other lenses may be adjusted by using the above illustrated method. An optical system having a larger number of lenses which are positioned relative to each other to a high accuracy may be manufactured accordingly.

Figure 5:
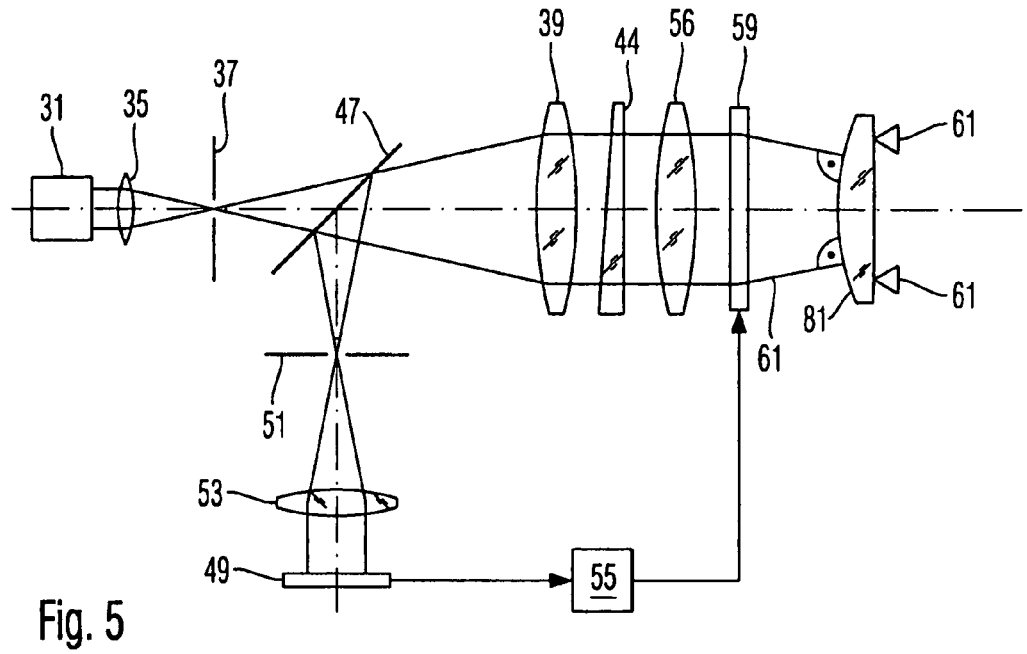
FIG. 5 shows an arrangement for calibrating the holograms of the interferometer shown in FIGS. 1 to 4.

For the above illustrated method it is necessary to produce the selectable holograms with the spatial light modulator 59. For this purpose, methods of ray-tracing are used for determining the excitation patterns of the spatial light modulator. For determining, for example, the hologram suitable for performing the measurement illustrated in FIG. 1, the beam path of measuring light beam 61 is simulated by a computer, and the simulated hologram is adjusted such that the simulated beam of measuring light is orthogonally incident of surface 7 of lens 5. For verifying the performance of the spatial light modulator 59, energized with the excitation pattern determined as illustrated above, it is possible to perform a calibrating measurement as illustrate in FIG. 5. For this purpose, a calibrating surface 81 is determined and manufactured such that the beam 61 shaped by the hologram is orthogonally incident on surface 81 at each location thereof if the generated hologram conforms with the ray-tracing calculation. This may be verified by comparing the generated interference pattern detected by detector 49 with the predetermined interference pattern which will be generated if the hologram conforms with the calculation. Deviations of the detected interference pattern from the predetermined interferogram are indicative of adjustments which may be made to the hologram, and the excitation pattern generated by the controller 59 may be changed accordingly. The corrected excitation pattern determined by such procedure can then be stored in a memory of the controller 55 as the selectable hologram for shaping the beam 61 of measuring light such that it is orthogonally incident on surface 7 as illustrated in FIG. 1. Calibrating surfaces 81 may be manufactured for each of the four selectable holograms necessary for performing the measurements illustrated in FIGS. 1 to 4, and corresponding calibrating measurements as illustrated in FIG. 5 may be performed for correcting the calculated holograms.

Figure 6:
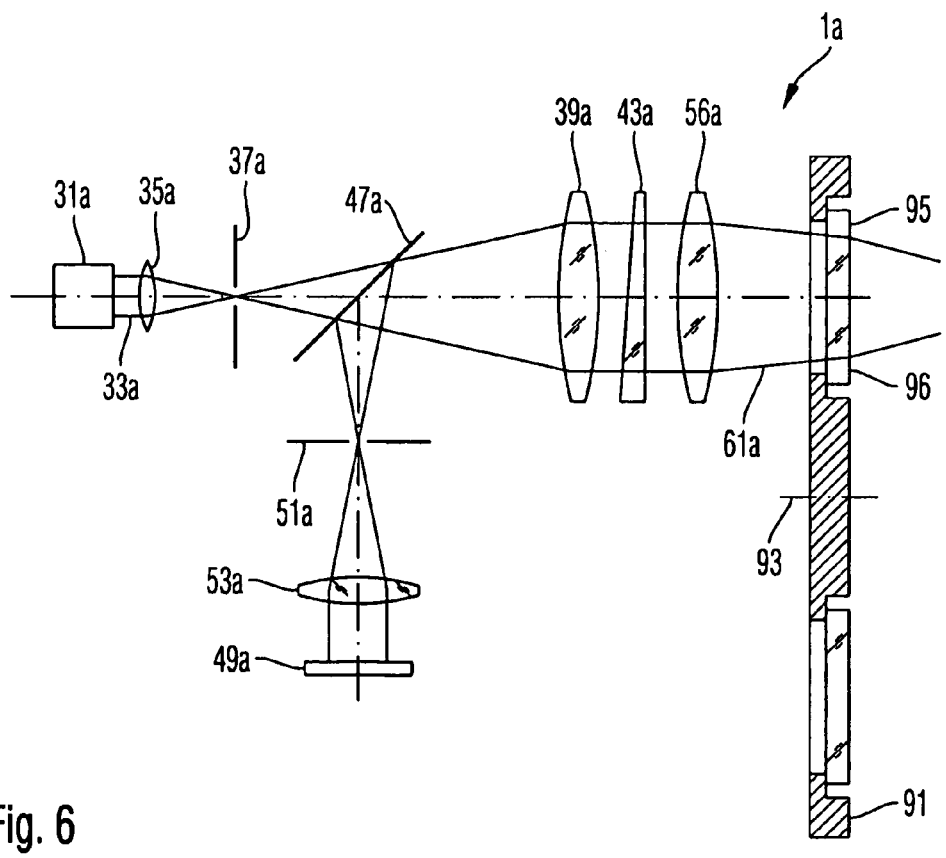
FIG. 6 shows a further embodiment of an interferometer apparatus having selectable holograms.
Figure 7:
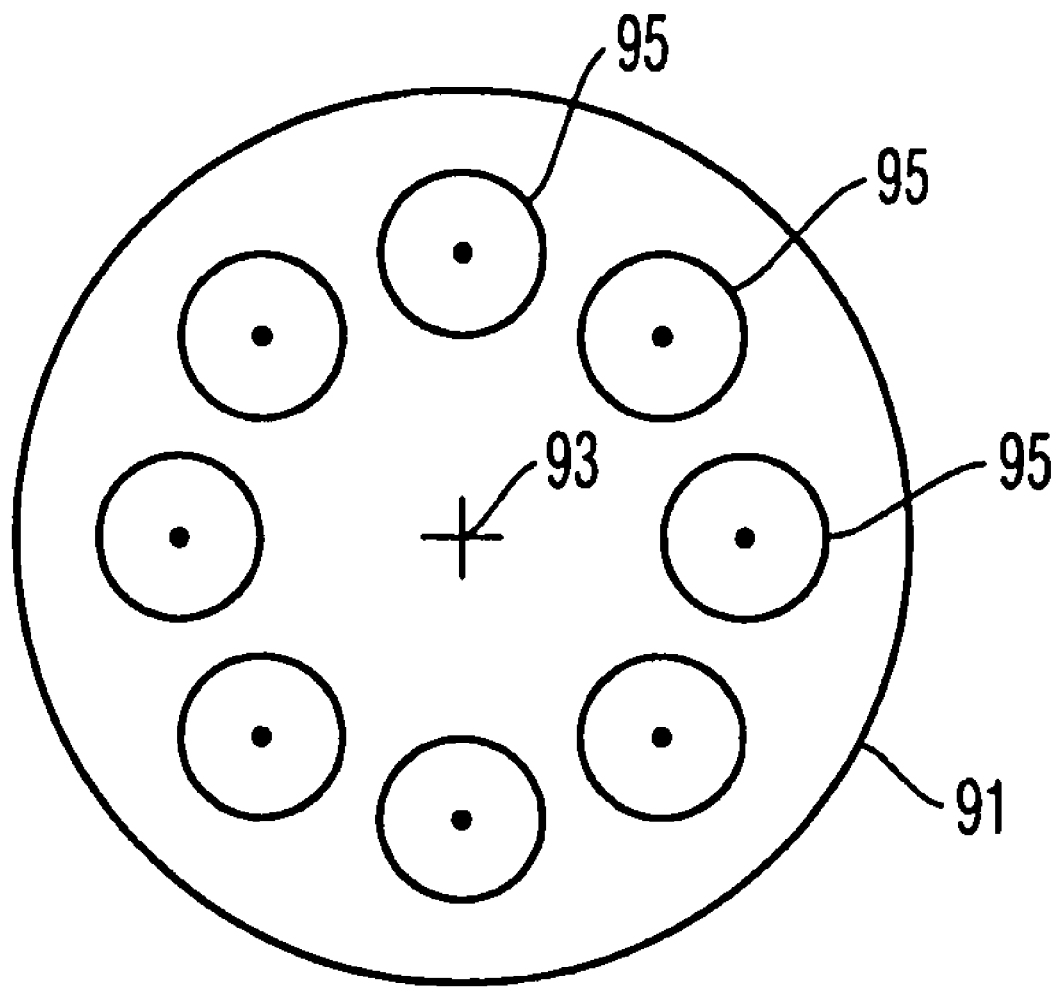
FIG. 7 is an elevational view of a hologram carrier shown in FIG. 6.

FIGS. 6 and 7 schematically illustrate an interferometer apparatus 1a in which the selectable holograms are provided as separate holograms provided on respective carriers rather than a spatial light modulator. The interferometer apparatus 1a comprises a hologram carrier 91 which is rotatable about an axis 93 such that one of eight holograms 95 may be selectively disposed in the beam path of a beam 61a of measuring light emitted from an interferometer optics 55a. Each hologram 95 is provided on a carrier substrate 96 made of glass, wherein the hologram is provided on a surface of the carrier 96 as a grating generated by lithographic methods. Background information with respect to holograms used in interferometry may be obtained from chapter 15 of the Textbook of Daniel Malacara, "Optical shop testing", 2nd edition, John Wiley & Sons Inc, 1992.

In the above illustrated embodiments, the beam of measuring light is shaped by an interferometer optics comprising at least one lens and the hologram. The interferometer optics provides additional refractive power such that an excessive line density and excessive changes in line densities of the holograms can be avoided. Depending on the application, it may be possible to omit the interferometer optics and to shape the beam of measuring light only by disposing the hologram downstream of the Fizeau surface.

Further, it is possible to include a lens providing additional refractive power in at least one of the holograms and carriers illustrated with reference to FIGS. 6 and 7 above. Thus, additional lenses may be selectively positioned in the beam path of the measuring beam for shaping the beam of measuring light.

Figure 8:
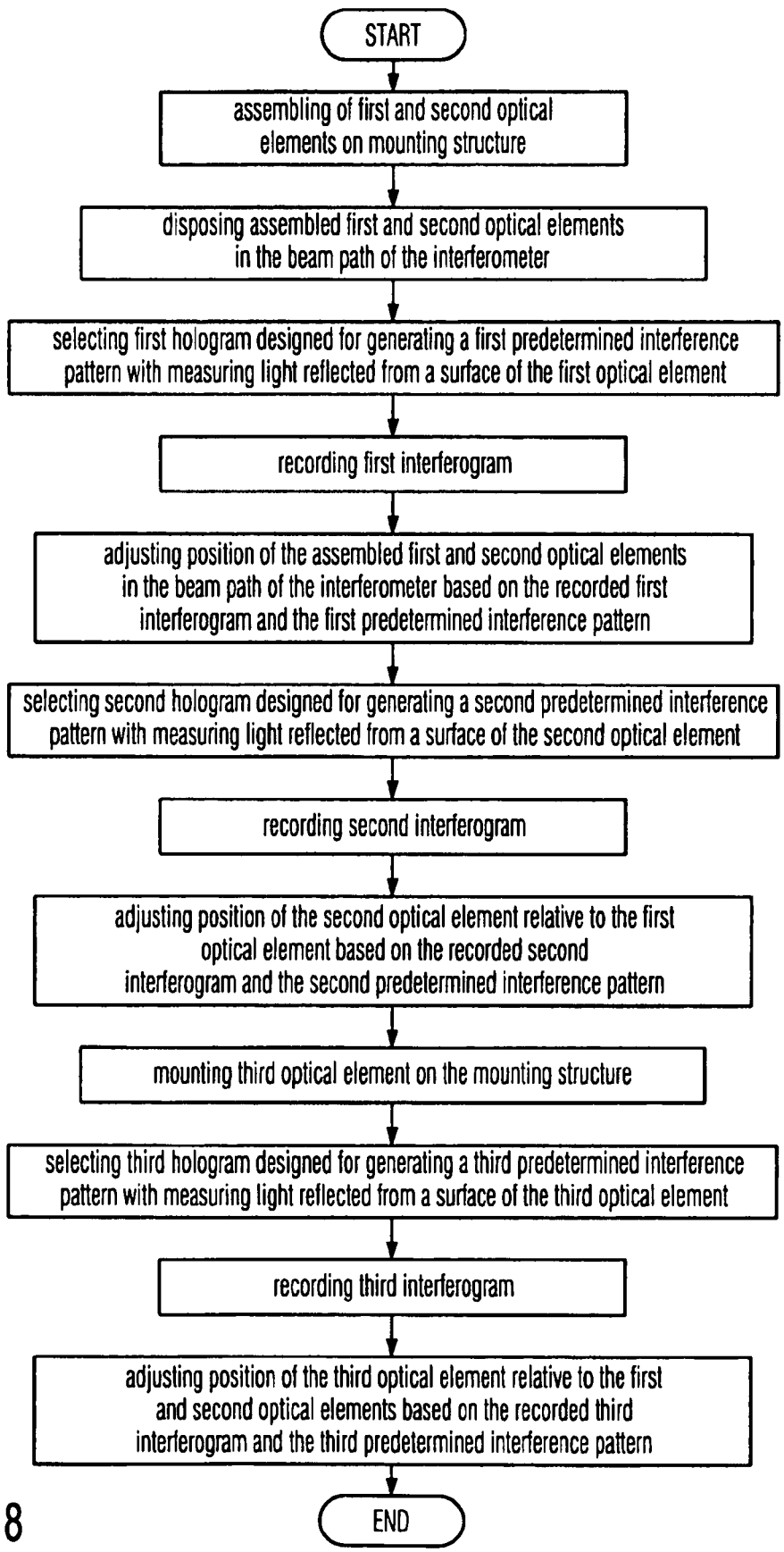
FIG. 8 is a flowchart illustrating an embodiment of a method for manufacturing an optical system.

FIG. 8 illustrates a summarizing flow chart of the methods of manufacturing an optical system illustrated above.

An embodiment of the invention is directed to a method of controlling an existing optical system herein. The existing optical system is used to perform the function it was designed for, i.e. a projection optical system is used in a lithographic process to expose wafers with reticle patterns. From time to time the exposure process is interrupted to readjust the projection exposure system. For this purpose, a wafer stage or reticle stage or portions thereof are removed from a vicinity of the projection exposure system, and an interferometer system as illustrated with reference to FIGS. 1 to 7 is mounted close to the object side or image side front lens of the projection exposure system to measure positions of lenses of the system relative to each other. By operating suitable actuators, the position of the lenses relative to each other may be adjusted to conform with a specification and to improve the optical performance of the projection exposure system, accordingly. Thereafter, the exposure process will be continued.

An example of a possible projection exposure system to which the above illustrated method can be applied is disclosed in U.S. Pat. No. 6,806,942 B2.

It is possible to apply the above illustrated methods also to all other possible types of optical systems. Examples are: telescopes used in astronomy, objective lenses for film cameras or still cameras, microscopes, such as binocular microscopes, binocular field glasses and any other possible optical system which may also include a combination of lenses and mirrors.

In the above illustrated embodiment, the interferometer system is of a Fizeau-type. It is to be noted, however, that the invention is not limited to such type of interferometer. Any other type of interferometer, such as a Twyman-Green interferometer and a Michelson-type interferometer may be used. Examples of these types of interferometers are illustrated in chapter 2.1 of the above mentioned textbook of Daniel Malacara.

In the description of the above illustrated embodiments, the measured interference pattern was illustrated as being directly detected by the detector. It is however possible to measure interference patterns by methods such as phase shifting interferometry, wherein a measured interferogram is determined from plural detected interference patterns. The plural interference patterns are detected with different phase setting generated by changing a wavelength of the measuring light or a position of the reference surface or by some other suitable means well-known in the art. In the present invention, the different phase settings may also be produced by changing the excitation patterns for producing the holograms.

While the invention has been described with respect to certain exemplary embodiments thereof, it is evident that many alternatives, modifications and variations will be apparent to those skilled in the art. Accordingly, the exemplary embodiments of the invention set forth herein are intended to be illustrative and not limiting in any way. Various changes may be made without departing from the spirit and scope of the present invention as defined in the following claims.

What is claimed is:

1. A method of manufacturing an optical system having plural optical elements mounted relative to each other on a mounting structure of the optical system, the method comprising:
disposing the optical system in a beam path of an interferometer apparatus having an interferometer optics and a selectable hologram for shaping a beam of measuring light to be incident on surfaces of the optical elements of the optical system;
selecting a first hologram of the interferometer apparatus and recording at least one first interference pattern generated by measuring light reflected from a surface of a first optical element;
selecting a second hologram of the interferometer apparatus, wherein the second hologram is different from the first hologram, and recording at least one second interference pattern generated by measuring light reflected from a surface of a second optical element, which is different from the first optical element; and
adjusting a position of the first optical element relative to the second optical element on the mounting structure based upon the first interference pattern and the second interference pattern.

2. The method according to claim 1, wherein the first hologram is selected such that the shaped measuring light reflected from the surface of the first optical element generating the first interference pattern is substantially orthogonally incident on the surface of the first optical element at plural locations of the surface of the first optical element.

3. The method according to claim 1, wherein the second hologram is selected such that the shaped measuring light reflected from the surface of the second optical element generating the second interference pattern is substantially orthogonally incident on the surface of the second optical element at plural locations of the surface of the second optical element.

4. The method according to claim 1, wherein the first hologram is selected such that the shaped measuring light reflected from the surface of the first optical element generating the first interference pattern is substantially focused on the surface of the first optical element.

5. The method according to claim 1, wherein the second hologram is selected such that the shaped measuring light reflected from the surface of the second optical element generating the second interference pattern is substantially focused on the surface of the second optical element.

6. The method according to claim 1, wherein the interferometer comprises a mounting structure selectively receiving a first carrier carrying the first hologram, or a second carrier carrying the second hologram.

7. The method according to claim 1, wherein the interferometer comprises a displaceable mounting structure carrying the first hologram and the second hologram, wherein the mounting structure is displaceable to selectively dispose the first hologram or the second hologram in the beam path of the beam of measuring light.

8. The method according to claim 1, wherein the interferometer comprises a spatial light modulator disposed in the beam path of the beam of measuring light and wherein the selecting of the first hologram comprises driving the spatial light modulator to produce the first hologram, and wherein the selecting of the second hologram comprises driving the spatial light modulator to produce the second hologram.

9. The method according to claim 1, wherein the first hologram comprises a plurality of diffractive elements fixedly provided on a carrier.

10. The method according to claim 1, further comprising calculating a structure of the first and second holograms using a ray tracing calculation based on a predetermined relative position of the first and second optical elements.

11. The method according to claim 1, wherein the adjusting of the position of the first optical element relative to the second optical element on the mounting structure is performed to reduce a deviation of the relative position of the first and second optical elements from a predetermined relative position of the first and second optical elements.

12. The method according to claim 1, further comprising:
adjusting a position of the optical system relative to the interferometer based on one of the first and second interference patterns.

13. The method according to claim 1, further comprising:
mounting a third optical element on the mounting structure of the optical system,
selecting a third hologram of the interferometer, wherein the third hologram is different from the first and second holograms, and recording at least one third interference pattern generated by measuring light reflected from a surface of the third optical element;
adjusting a position of the third optical element relative to the first and second optical elements on the mounting structure based upon the third interference pattern.

14. The method according to claim 1, further comprising:
disposing a first calibrating optical element in the beam path of the interferometer; and
recording at least one fourth interference pattern generated by measuring light having interacted with the first calibrating optical element; and
wherein the adjusting of the position of the first optical element relative to the second optical element is further based upon the fourth interference pattern.

15. An optical system manufactured by using the method of claim 1.

16. The optical system according to claim 15, wherein the optical system is a projection exposure system configured to expose a substrate disposed in an image plane of the optical system with an image of a patterning structure disposed in an object plane of the optical system.

17. A method of controlling an optical system, wherein the optical system comprises plural optical elements mounted relative to each other on a mounting structure of the optical system, and an interferometer having an interferometer optics and a selectable hologram for shaping a beam of measuring light to be incident on surfaces of the optical elements of the optical system,
wherein the method comprises:
selecting a first hologram of the interferometer and recording at least one first interference pattern generated by measuring light reflected from a surface of a first optical element of the optical system;
selecting a second hologram of the interferometer, wherein the second hologram is different from the first hologram, and recording at least one second interference pattern generated by measuring light reflected from a surface of a second optical element of the optical system, wherein the second optical element is different from the first optical element; and
adjusting a position of the first optical element relative to the second optical element on the mounting structure based upon the first interference pattern and the second interference pattern.

18. A method of controlling an optical system, wherein the optical system comprises plural optical elements mounted relative to each other on a mounting structure of the optical system, and an interferometer having an interferometer optics and a first hologram for shaping a beam of measuring light to be incident on surfaces of the optical elements of the optical system, wherein the method comprises:

shaping the beam of measuring light using the first hologram and recording at least one first interference pattern generated by measuring light reflected from a surface of a first optical element of the optical system; and adjusting a position of the first optical element relative to a second optical element on the mounting structure based upon the first interference pattern.

* * * * *